United States Patent

[11] 3,577,047

[72] Inventor George Cheroff
Hopewell Junction, N.Y.

[21] Appl. No. 791,254
[22] Filed Jan. 15, 1969
[45] Patented May 4, 1971
[73] Assignee International Business Machines Corporation Armonk, N.Y.

[54] FIELD EFFECT DEVICE
5 Claims, 3 Drawing Figs.

[52] U.S. Cl. .......... 317/235, 307/304, 250/211
[51] Int. Cl. .......... H01l 11/14
[50] Field of Search .......... 317/235.27, 235.21.1, 235.22.2, 235; 307/304

[56] References Cited

UNITED STATES PATENTS 3,459,944 8/1969 Triebwasser .......... 250/211

OTHER REFERENCES

Wallmark et al., FIELD EFFECT TRANSISTORS, PHYSICS, TECHNOLOGY AND APPLICATIONS, N.J., Prentice-Hall, 1966, pages 264— 265, copy in Gr. 253.

*Primary Examiner*—John W. Huckert
*Assistant Examiner*—Martin H. Edlow
*Attorneys*—Hanifin and Jancin and Isidore Match

ABSTRACT: A field-effect device is provided which comprises a field effect transistor of the insulated gate type. The device is capable of being used as a photodetector with a gain greater than unity. To this end, the transistor is biased in the "off" state by a substrate potential (source-to-substrate) resulting from the provision of an external voltage supply in the source-to-substrate loop. Upon the radiation of the source and drain junctions in the transistor, a current is caused to flow between the source and drain electrodes which result in a current gain in excess of unity.

PATENTED MAY 4 1971

3,577,047

INVENTOR
GEORGE CHEROFF
BY Isidore Match
ATTORNEY

FIELD EFFECT DEVICE

BACKGROUND OF THE INVENTION

This invention relates to photoresponsive semiconductive devices. More particularly, it relates to an improved photoresponsive insulated gate field-effect transistor device.

Insulated gate field-effect transistors are known and generally include two regions of one conductivity type, such as an N-type separated by a P-type region, thereby forming therewith two PN junctions. The two N-type regions are referred to as the source and drain and a bias voltage is applied to these regions to forward bias one junction and to reverse bias the other junction. The conductivity between the source and drain is controlled by applying signals to a gate electrode mounted on one surface of the body and bridging the portion of the body separating the source and drain electrodes. The voltage signals applied to the gate electrode produce electric fields which alter the conductivity characteristics of at least a channel in the material separating source and drain and permit current flow between these two regions.

In this type of field-effect device, the gate is insulated from the surface of the semiconductor body and, in another form, the gate electrode makes ohmic connection to the semiconductor body. Field-effect devices of the latter type have been employed in photoresponsive applications in which input radiant energy changes the conductivity of the gate region and alters current flow in the gate circuit. The current flow in the gate circuit generates a voltage at the gate electrode which, in turn, produces an electric field that is applied to the gate region. The field alters the conductivity of the region so that an amplified current flow is obtained between source and drain.

It is an object of this invention to provide a photoresponsive field-effect transistor of the insulated gate type wherein there can be achieved a current gain which exceeds unity.

It is another object of this invention to provide a field-effect device in accordance with the preceding object which lends itself advantageously to integration techniques.

It is a further object to provide a field-effect device in accordance with the preceding objects wherein operating frequency and current gain can be readily designed.

SUMMARY OF THE INVENTION

Generally speaking, and in accordance with the invention, there is provided a radiant energy responsive circuit. The circuit comprises an insulated gate field-effect transistor of the type which includes a substrate body of semiconductor material of one conductivity type having at one surface thereof first and second spaced regions of a conductivity type opposite to said one conductivity type to form first and second junctions, a gate electrode mounted above the one surface and insulated therefrom, the gate electrode bridging the first and second regions, and means in circuit with the junctions for biasing one of the junctions in the forward direction and the other of the junctions in the reverse direction to thereby provide source and drain electrodes in the device. There if further included means for providing a potential between the source and the substrate to produce a source-to-substrate potential to bias the device in the off state whereby, upon the incidence of radiant energy on the junctions, the current between the source and drain electrodes is of an amount sufficient to provide a current gain greater than unity.

The foregoing and other objects, features and advantages of the invention will be apparent from the following more particular description of a preferred embodiment of the invention, as illustrated in the accompanying drawing.

DESCRIPTION OF A PREFERRED EMBODIMENT

Figure 1:
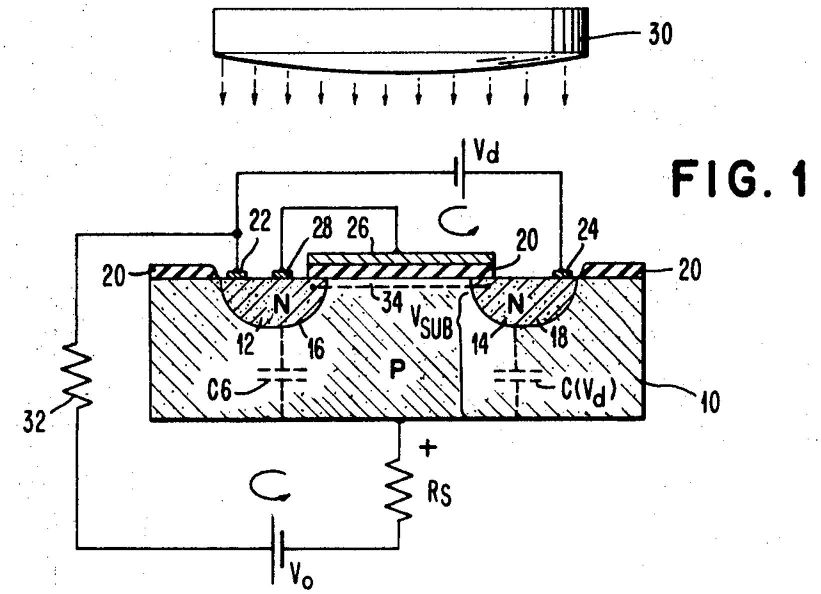
FIG. 1 is a partly schematic, partly sectional view of a photosensitive field-effect device constructed in accordance with the principles of the invention.

Referring to FIG. 1, the physical structure of the field-effect transistor shown therein is the semiconductor body and associated electrodes for the known field-effect transistor. Such structure comprises a bulk body 10 of a given conductivity type, generally P-type conductivity and commonly referred to as the substrate. Body 10 contains two N-type regions 12 and 14 which have been diffused thereinto to form two PN junctions 16 and 18 respectively. These junctions extend to the surface of body 10, body 10 being covered with an insulating layer of silicon dioxide 20, portions of which have been broken away to illustrate more clearly the electrical connections to the device. Ohmic contacts 22 and 24 are made to regions 12 and 14 respectively. A gate electrode 26 is provided on the portion of silicon dioxide layer 20 which bridges PN junctions 16 and 18. It is noted that the portion of the layer on which electrode 26 is mounted is thinner than overall layer 20 as indicated at the ends of the surface of body 10. Ohmic contact 24 is connected to the positive terminal of source-drain potential source $V_d$ and ohmic connection 22 is connected to the negative terminal of source $V_d$. Electrode 22 is consequently the drain electrode and electrode 24 is the source electrode. Gate electrode 26 is connected to region 12 through an ohmic contact 28 whereby it is quiescently at the potential of this region. Light is incident on the source region and penetrates through region 12 to the junction interface at junction 16. The region 12—16 can be considered to be a photodiode.

An external voltage supply source $V_0$ has its positive terminal connected to the source $V_d$ through a resistance 32 and its negative terminal connected to substrate 10 through a resistance legended $R_S$. The voltage developed across the substrate biases the field-effect transistor device to the "off" state by a substrate potential (source-to-substrate) $V_{sub}$ in the source-substrate loop. In this connection, it is to be realized that, with a suitable choice of substrate resistivity, the device is normally in the "on" state without substrate bias. Such condition is normally achieved on an N-channel type device. When light is applied to source-drain junctions 18 and 16 respectively, the net reverse bias current, which is induced by the injection of electron hole pairs in the substrate, increases to result in an additional voltage drop across resistance $R_{sub}$. The resistance $R_{sub}$ is a diffused resistance formed by the geometry of the source junction. If the amount that the net reverse bias current is increased is considered to be $\delta i$, then as a consequence, $V_{sub}$ is lowered by an amount $\delta i_1 R_{sub}$ and the source-drain current is increased by an amount $\delta i_{SD}$. Therefore, the current gain $\beta$ can now be calculated through the substrate transconductance $g_m{}^s$, i.e., $$\beta = g_m{}^s R_{sub} = \frac{\delta i_{SD}}{\delta i_1} \qquad (1)$$

The current gain divided by the charging time of the source capacity $C(V_d)$ may be defined as the gain bandwidth of the device, i.e., $$\frac{g_m{}^s R_{sub}}{2\pi R_{sub} C(V_d)} = \frac{g_m{}^s}{2\pi C}$$

It is convenient to use the gradual channel formulation for a calculation of $g_m{}^s$, i.e., $$i_{SD} = \int_0^{V_d} G(V)\, dV$$

wherein $i_{SD}$ is the source-drain current, $G(V)$ is the differential conductance and $V_d$ is the source-to-drain potential.

For the substrate transconductance, there need only be considered the bulk charge term $Q_B$ for the transconductance calculation, wherein $\mu$ is the surface mobility, $w$ is the channel width and L is the source-drain distance:

$$g_m{}^s=\frac{W}{L}\mu\frac{\partial}{\partial V_{sub.}}\int_0^{V_d} Q_B(V)\,dV=\frac{W}{L}\mu\frac{\partial}{\partial V}\int_0^{V_d} Q_B(V)dV$$

where $$Q_B(V)=\sqrt{2N_AqK_s\,(\psi+V_{sub.}+V)}$$

then $$g_m{}^s=\frac{W}{L}\mu\,(Q(V_d)-Q(0)) \qquad (2)$$

The capacity along the channel is by definition $$C(V)=\frac{\partial Q_B(V)}{\partial V}=\frac{1}{2}\frac{Q(V)}{\psi+V_{sub.}+V}=\frac{1}{2}\sqrt{\frac{2N_AqK_s}{(\psi+V_{sub.}+V)}}$$

Consequently $$\frac{C(V_d)}{C(0)}=\frac{Q(0)}{Q(V_d)}=\sqrt{\frac{V_{sub.}+\psi}{V_d+V_{sub.}+\psi}}$$

where $C(V_d)$ and $C(0)$ are the source and drain capacities per unit area respectively. Thus, $$g_m{}^s=\frac{2w}{L}\mu C(0)\left[\sqrt{\frac{V_d+V_{sub.}+\psi}{(\psi+V_{sub.})}}-1\right](\psi+V_{sub}) \qquad (3)$$

for the constant $\mu$ approximation.

The (current) gain bandwidth $\beta/\tau$ is $$\frac{\beta}{\tau}=\frac{g_m{}^s}{2\pi C}=\frac{w}{AL\pi}\mu V_{sub}\left[\sqrt{\frac{Vd}{V_{sub}}+1}-1\right] \qquad (4)$$

where $\tau=R_sC$, the time for the source potential to readjust itself $C=C(0)A$ A=source junction area It is to be noted that the gain bandwidth is inversely proportional to the cell size, i.e., $$\frac{W}{A}\sim\frac{1}{W}$$

Figure 2:
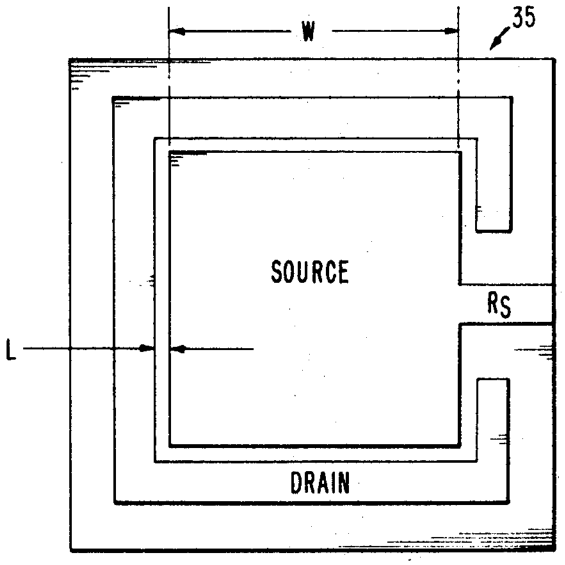
FIG. 2 is a schematic diagram illustrating the invention.

The foregoing phenomena is considered in conjunction with the structure, i.e., cell shown in FIG. 2. In this FIG., in the cell 35, the source junction area is chosen to be a square having a dimension W on a side and a channel length L. The source-drain and series resistance $R_S$ are formed through a shallow diffusion of 2000 ohms/square. Such shallow diffusion permits light incident on the cell to penetrate to the junction below the surface so that electron hole pairs can be generated by the incident radiation. An antireflection coating over the diffused regions would normally be provided, such as for example, the type used in a commercial diode photocell.

Let it be assumed that the following constants and operating conditions obtain relative to the cell shown in FIG. 2.

W=10 mils
L=0.5 mil
A=100 square mils
$C(0)=3.8\times10^{-2}\mu\mu$f/square mil
$C=3.8\mu\mu$f
$V_d$=24 volts
$V_s$=10 volts
$V_T$=1.0 volt
$\mu_s$=800 volt-sec/cm$^2$
$w$=38 mils
$\rho$(substrate) = 2 ohm-cm
sheet $\rho$(diffusion) = 2000 ohm/square Applying equation (4) as set forth hereinabove, $$\frac{g_m{}^s}{2\pi C}=2.8\times10^8 \text{ cycles/sec.}=\text{gain } f$$

wherein $f$ is the operating frequency.

Let it be assumed, for example, that a frequency of $10^7$ cycles/sec is desired. This fixes the value of $R_s$. Accordingly $$\frac{1}{f}=2\pi R_sC$$

$R_s=4.6$K
gain $=28=g_mR_s$
$g_m{}^s=6100\mu$ohms

A sensitivity of 0.5$\mu$ampere/$\mu$watt and a signal of 10$\mu$ watts yields 140$\mu$amperes (for band gap radiation) in the source-drain loop.

Figure 3:
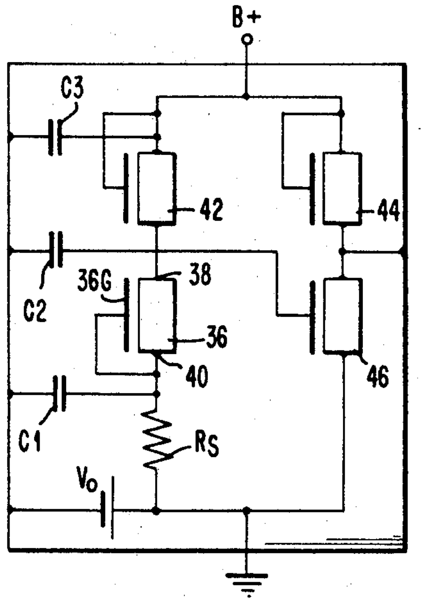
FIG. 3 is an embodiment depicting a utilization of the device.

In the arrangement shown in FIG. 3, a cell 36 constructed in accordance with the principles of the invention comprises a gate electrode 36 to which signals are applied to control current flow between a source terminal 38 and a drain terminal 40. The cell is biased in the off state by the external voltage $V_O$. The series resistance $R_S$ is provided as has been set forth hereinabove. A load, field-effect transistor 42 is connected between cell 36 and the B+ potential source. Field-effect transistors 44 and 46 constitute an inverter circuit which is driven into by the combination of cell 36 and load field effect transistor 42.

In the operation of the arrangement shown in FIG. 3, the net current gain of the system is in the order of $g_m{}^s\,g_m{}^g\,R_s{}^2$, where $g_m{}^g$ is the transconductance of the driver circuit.

To summarize the foregoing, in accordance with the invention, by providing an external supply in the source-substrate loop of a field-effect transistor, a depletion mode device is biased in the "off" state by a substrate potential (source-to-substrate). With this arrangement, a field-effect transistor can be used as a photodetector with a gain greater than unity. The resistance $R_{sub}$ is provided by proper design of the source junction. The field-effect transistor portion of the structure can provide gain with essentially little sacrifice in area. As seen in FIG. 2, the portion of the total area occupied by the field-effect transistor is 4L/W. Accordingly, the invention lends itself advantageously to integrated techniques.

Further in connection with the inventive device, it is to be realized that other trade-offs of speed and resistivity can be made by adjusting $R_S$. In addition, an array can be integrated with no additional isolation and a signal is amplified to a useful level on an array matrix thereby reducing costs of peripheral special circuits, and also decreasing the problems of noise tolerance.

While the invention has been particularly shown and described with reference to a preferred embodiment thereof, it will be understood by those skilled in the art that various changes in form and details may be made therein without departing from the spirit and scope of the invention.

I claim:

1. A radiant energy responsive circuit comprising:

an insulated gate field-effect transistor of the type including a substrate body of semiconductor material of one conductivity type having at one surface thereof, first and second spaced regions of a conductivity type opposite to said one conductivity type to form first and second junctions;

a gate electrode associated with said body and insulated therefrom;

means in circuit with said junctions for biasing one of said junctions in the forward direction and the other of said junctions in the reverse direction to thereby provide source and drain electrodes respectively;

means for providing a potential between said source and said substrate to produce a source-to-substrate potential to bias said transistor in the off state;

and means for providing radiant energy to said junctions whereby upon the incidence of radiant energy on said junctions, the current between said source and drain electrodes is of an amount sufficient to provide a current gain greater than unity.

2. A radiant energy responsive circuit comprising:

an insulated gate field-effect transistor of the type including a substrate body of semiconductor material of one conductivity type having at one surface thereof, first and second spaced regions of a conductivity type opposite to said one conductivity type to form first and second junctions;

a gate electrode mounted above said one surface and insulated therefrom, said gate electrode bridging said first and second regions;

means in circuit with said junctions for biasing one of said junctions in the forward direction and the other of said junctions in the reverse direction to thereby provide source and drain electrodes respectively;

means for providing a potential between said source and said substrate to produce a source-to-substrate potential to bias said transistor in the off state;

and means for providing radiant energy to said junctions whereby upon the incidence of radiant energy on said junctions, the current between said source and drain electrodes is of an amount sufficient to provide a current gain greater than unity.

3. A circuit as defined in claim 1 and including a resistance in circuit with said substrate and said potential producing means for biasing said radiant energy responsive circuit in the nonconductive state.

4. A circuit as defined in claim 3 and including a channel at said one surface connecting said first and second regions which includes an inversion layer of the same conductivity type as said first and second regions.

5. A circuit as defined in claim 3 wherein said gate electrode is transparent to said radiant energy, and said radiant energy is passed through said gate electrode and applied to said channel.